(12) United States Patent
Riedel et al.

(10) Patent No.: US 12,248,122 B2
(45) Date of Patent: Mar. 11, 2025

(54) SWIR-MWIR TRANSPARENT, CONDUCTIVE COATING FOR EMI PROTECTION OF NCOC

(71) Applicant: Raytheon Company, Waltham, MA (US)

(72) Inventors: Eric Riedel, Cambridge, MA (US); Ralph Korenstein, Natick, MA (US)

(73) Assignee: Raytheon Company, Arlington, VA (US)

( * ) Notice: Subject to any disclaimer, the term of this patent is extended or adjusted under 35 U.S.C. 154(b) by 934 days.

(21) Appl. No.: 17/164,157

(22) Filed: Feb. 1, 2021

(65) Prior Publication Data
US 2022/0244431 A1 Aug. 4, 2022

(51) Int. Cl.
*G02B 1/116* (2015.01)
*C23C 14/08* (2006.01)
(Continued)

(52) U.S. Cl.
CPC ............ *G02B 1/116* (2013.01); *C23C 14/081* (2013.01); *C23C 14/086* (2013.01); *C23C 14/35* (2013.01); *G02B 1/14* (2015.01); *G02B 1/16* (2015.01)

(58) Field of Classification Search
CPC .. G02B 1/116; G02B 1/14; G02B 1/16; C23C 14/081; C23C 14/086; C23C 14/35; H05K 9/0005; H05K 9/00
See application file for complete search history.

(56) References Cited

U.S. PATENT DOCUMENTS

| | | | | | |
|---|---|---|---|---|---|
| 4,704,339 A | * | 11/1987 | Green | ..................... | C23C 16/32 |
| | | | | | 428/688 |
| 4,710,433 A | * | 12/1987 | Rowe | ..................... | C04B 41/89 |
| | | | | | 428/629 |

(Continued)

FOREIGN PATENT DOCUMENTS

| EP | 0438398 A1 | 7/1991 |
|---|---|---|
| EP | 3453783 A2 | 3/2019 |

(Continued)

OTHER PUBLICATIONS

International Preliminary Report on Patentability for PCT Application Serial No. PCT/US2022/014114, dated Aug. 10, 2023, 9 pages.

(Continued)

*Primary Examiner* — Balram T Parbadia
*Assistant Examiner* — John Curtis Sipes
(74) *Attorney, Agent, or Firm* — Kinney & Lange, P.A.

(57) ABSTRACT

A shortwave to midwave infrared (SWIR-MWIR) optical window includes a substrate formed from a nanocomposite optical ceramic material and a coating disposed on the substrate to provide electromagnetic interference (EMI) protection. The coating is electrically conductive and SWIR-MWIR transparent and comprises a doped zinc oxide material. A method of protecting an EO/IR sensor from electromagnetic interference (EMI) includes depositing a thin film electrically conductive and SWIR-MWIR transparent coating over a surface an optical window of the EO/IR sensor. The optical window is formed from a nanocomposite optical ceramic material and has a curved surface. The thin film electrically conductive and SWIR-MWIR transparent coating comprises an electrically conductive zinc oxide material.

16 Claims, 1 Drawing Sheet

(51) Int. Cl.
*C23C 14/35* (2006.01)
*G02B 1/14* (2015.01)
*G02B 1/16* (2015.01)

(56) References Cited

U.S. PATENT DOCUMENTS

| | | | | |
|---|---|---|---|---|
| 4,778,731 A | * | 10/1988 | Kraatz | G02B 1/02 |
| | | | | 359/359 |
| 4,826,266 A | * | 5/1989 | Baird | G02B 1/02 |
| | | | | 359/359 |
| 4,939,043 A | * | 7/1990 | Biricik | G02B 1/02 |
| | | | | 428/641 |
| 5,173,443 A | * | 12/1992 | Biricik | G02B 1/10 |
| | | | | 148/DIG. 80 |
| 5,820,957 A | * | 10/1998 | Schroeder | G02B 1/12 |
| | | | | 359/359 |
| 2012/0225767 A1 | * | 9/2012 | Imholt | C04B 35/44 |
| | | | | 264/1.21 |
| 2017/0062192 A1 | * | 3/2017 | Oota | H01L 29/78696 |
| 2018/0095191 A1 | * | 4/2018 | Trent | C04B 35/645 |
| 2019/0040523 A1 | * | 2/2019 | Ganjoo | C23C 14/081 |
| 2021/0188713 A1 | * | 6/2021 | Lee | C04B 35/475 |

FOREIGN PATENT DOCUMENTS

| | | |
|---|---|---|
| JP | H04504027 A | 7/1992 |
| JP | 2019532248 A | 11/2019 |
| WO | WO-2015199624 A1 * 12/2015 | ............. G02B 1/116 |

OTHER PUBLICATIONS

International Search Report and Written Opinion from PCT Application Serial No. PCT/US2022/014114, dated Jul. 7, 2022, 12 pages.

Japanese Office Action from Japanese Application No. 2023-546204, dated Jul. 16, 2024, 6 pages.

* cited by examiner

SWIR-MWIR TRANSPARENT, CONDUCTIVE COATING FOR EMI PROTECTION OF NCOC

BACKGROUND

The present invention is directed generally to electromagnetic interference (EMI) protection of sensors and more particularly to EMI protection of shortwave to midwave infrared (SWIR-MWIR) transparent windows.

Sensing systems that operate in the electromagnetic spectrum are vulnerable to EMI or radio-frequency interference from external sources. EMI can negatively affect performance of the sensor, causing disruption, or can jam the sensor, causing loss of function or failure. As such, many sensitive electronic sensing systems require EMI protection. Current solutions for providing EMI protection include applying sections of metallic or carbon nanotube grids to an optical element. The conductive grid reflects undesired electromagnetic energy while openings in the grid maintain transparency of the optical element. While effective for generally flat windows, the grid structures are not easily applied to curved geometries, such as hemispherical or ogive-shaped domes. Because application of metallic or carbon nanotube grids to curved surfaces is labor intensive and thereby expensive, application is generally limited to covering only portions of a dome-shaped optical element.

New EMI protection systems are needed to provide EMI protection over a full area of dome-shaped optical elements, and more specifically, new EMI protection systems are needed for SWIR-MWIR transparent dome-shaped optical elements.

SUMMARY

In one aspect, a shortwave to midwave infrared (SWIR-MWIR) optical window includes a substrate formed from a nanocomposite optical ceramic material and a coating disposed on the substrate to provide electromagnetic interference (EMI) protection. The coating is electrically conductive and SWIR-MWIR transparent and comprises a doped zinc oxide material.

In another aspect, a method of protecting an EO/IR sensor from electromagnetic interference (EMI) includes depositing a thin film electrically conductive and SWIR-MWIR transparent coating over a surface an optical window of the EO/IR sensor. The optical window is formed from a nanocomposite optical ceramic material and has a curved surface. The thin film electrically conductive and SWIR-MWIR transparent coating comprises an electrically conductive zinc oxide material.

The present summary is provided only by way of example, and not limitation. Other aspects of the present disclosure will be appreciated in view of the entirety of the present disclosure, including the entire text, claims and accompanying figures.

Figure 1:
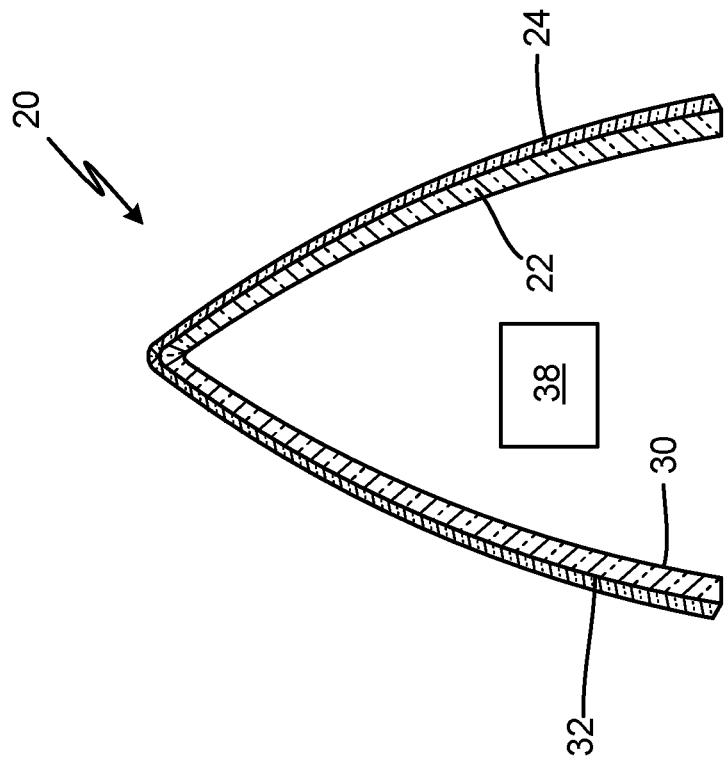
FIG. 1 is a cross-sectional view (with an expanded close-up) of an electro-optical or infrared (EO/IR) sensor optical element having a hemispherical dome shape and conformal conductive and shortwave to midwave infrared (SWIR-MWIR) transparent coating.

While the above-identified figures set forth embodiments of the present invention, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features, steps and/or components not specifically shown in the drawings.

DETAILED DESCRIPTION

Many optical applications, including guidance systems, receive and send energy in the infrared (IR) region of the electromagnetic spectrum. The optical elements used in these systems, such as domes and windows, must be transmissive in the IR spectrum and capable of protecting the electro-optical or infrared (EO/IR) sensors and other components, which they shield, from harsh environmental conditions. Additionally, there is demand for optical elements to protect EO/IR sensors from electromagnetic interference (EMI). Conventional EMI grids used for planar windows are not easily applied to domes and when applied, are generally limited in area, covering only a portion of the optical element. A conductive and shortwave to midwave IR (SWIR-MWIR) transparent thin film coating, as disclosed herein, can provide full EMI protection for SWIR-MWIR windows and domes. The conductive SWIR-MWIR transparent coating can be applied with uniformity to complex and curved geometries.

Figure 2:
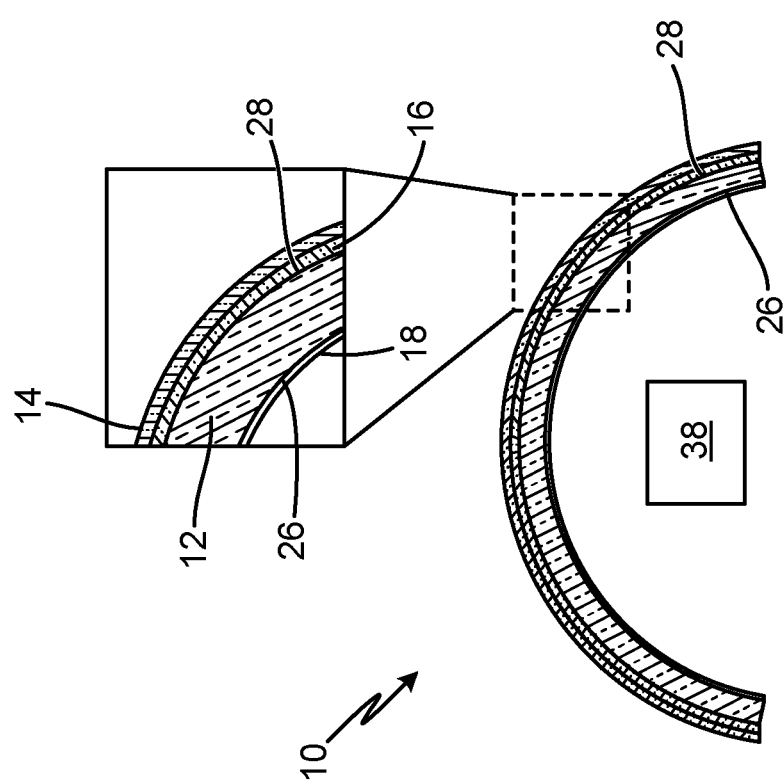
FIG. 2 is a cross-sectional view of an EO/IR sensor optical element having an ogive dome shape and conformal conductive and SWIR-MWIR transparent coating.

FIG. 1 is a cross-sectional view of an electro-optical or infrared (EO/IR) sensor optical element having a hemispherical dome shape and conformal thin film conductive and SWIR-MWIR transparent coating. FIG. 1 further includes an expanded close-up of this infrared (EO/IR) sensor optical element. FIG. 2 is a cross-sectional view of an EO/IR sensor optical element having an ogive dome shape and conformal thin film conductive and SWIR-MWIR transparent coating. FIGS. 1 and 2 are discussed together herein. The optical elements disclosed herein can be used to protect EO/IR sensors in a variety of applications, including but not limited to, commercial and military applications, such as airborne optical imaging systems for target acquisition, identification, and guidance. Application of the disclosed conformal thin film conductive and SWIR-MWIR transparent coating is not limited to the optical element shapes illustrated in FIGS. 1 and 2. As will be understood by one of ordinary skill in the art, the disclosed conductive and SWIR-MWIR transparent coating can be applied to a variety of optical element shapes, including but not limited to aerodynamic domes, planar windows, and various curved (e.g., convex and concave) geometries.

FIG. 1 shows optical element 10 having substrate 12, conductive and SWIR-MWIR transparent coating 14, optional intermediate layer 16, and optional anti-reflective coating 18. FIG. 2 shows optical element 20 having substrate 22 and conductive and SWIR-MWIR transparent coating 24. Intermediate layer 16 and anti-reflective coating 18 are omitted in the illustration of optical element 20 but can be optionally included as described with respect to dome 10 of FIG. 1. Substrate 12 has inner side 26 and outer side 28. Substrate 22 has inner side 30 and outer side 32. Conductive and SWIR-MWIR transparent coating 14 can be disposed over outer side 28 of optical element 10. Conductive and SWIR-MWIR transparent coating 24 can be disposed over outer side 32 of optical element 20. Optional intermediate layer 16 can be disposed between substrate 12 and conductive and SWIR-MWIR transparent coating 14. Optional anti-reflective coating 18 can be disposed on inner side 26 of substrate 12. Optical elements 10 and 20 shield EO/IR sensor 38.

Substrate 12, 22 can be a SWIR or MWIR nanocomposite optical ceramic (NCOC). NCOC materials have been shown to offer enhanced mechanical strength and thermal shock resistance over conventional optical element materials including sapphire, spinel, polycrystalline alumina, aluminum oxynitride, and have been developed for use in military optical imaging systems. NCOC is a multi-phase composite material formed of a mixture of two or more ceramic phases that are mutually insoluble, thereby forming a multi-phase grain structure having distinct phase separation between two constituents. The multi-phase grain structure remains distinct after processing such that separation between the phases can be observed.

NCOC optical elements, including domes and windows, have been successfully manufactured using near-net shape powder processing techniques. Nano-sized ceramic powders are packed into a mold and pressed to produce a green body having a general shape of the optical element but with increased thickness. The green bodies are then sintered to remove any organics added during powder processing and to achieve a high density (>96%). Finally, hot isostatic pressing (applying pressure and heat) to the sintered body forms a fully densified blank having a near-net shape of the optical element. Final shape finishing, including precision grinding and polishing, can be provided to achieve a final shape of the optical element.

In one embodiment, substrate 12, 22 is a NCOC formed from first and second oxide nanograin materials selected from yttria ($Y_2O_3$), magnesia (MgO), aluminum oxide ($Al_2O_3$), magnesium aluminum oxide ($MgAl_2O_4$), zirconia ($ZrO_2$), calcium oxide (CaO), beryllium oxide (BeO), silica ($SiO_2$), and germanium oxide ($GeO_2$). For example, the first oxide nanograin material can be yttria and the second oxide nanograin material can be magnesia. The NCOC material can be composed of two or more of any of the disclosed ceramic phases provided the ceramic phases are mutually insoluble. Dopants can be added to one or both phases to change the refractive index. The NCOC material composition can be selected to provide desired optical and mechanical properties for a particular application. For example, two or more nanograin materials can be selected based on optical transmittance in a particular portion of the IR spectrum. Specifically, NCOC material composition is selected to provide transmittance in the SWIR-MWIR spectrum with a targeted wavelength range of about 2 µm to about 8 µm. In one embodiment, an MWIR NCOC optical element can be formed from a mixture of $Y_2O_3$:MgO (e.g., approximately 50:50 mixture by volume). In another embodiment, an SWIR NCOC optical element can be formed from a mixture of $Y_2O_3$:MgO with a nickel oxide dopant in the MgO phase.

Conductive and SWIR-MWIR transparent coating 14, 24 is an SWIR-MWIR transparent and electrically conductive coating that can be applied as a thin film conformal coating over outer side 28 of substrate 12 and outer side 32 of substrate 22. Conductive and SWIR-MWIR transparent coating 14, 24 can be applied directly to an outer surface of substrate 12, 22 or can be applied to an outer surface of one or more intermediate layers, such as intermediate layer 16. Conductive and SWIR-MWIR transparent coating 14, 24 can be applied to fully cover outer side 28, 32 with a substantially uniform thickness, thereby providing substantially uniform EMI protection over all portions of optical element 10, 20.

In alternative embodiments, conductive and SWIR-MWIR transparent coating 14, 24 can be applied as a thin film conformal coating over inner side 26, 30 of substrate 12, 22. As described above, conductive and SWIR-MWIR transparent coating 14, 24 can be applied directly to an outer surface of substrate 12, 22 on inner side 26, 30 or can be applied to an outer surface of one or more intermediate layers (e.g., intermediate layer 16) applied to inner side 26, 30. Conductive and SWIR-MWIR transparent coating 14, 24 can be applied to fully cover inner side 26, 30 with a substantially uniform thickness, thereby providing substantially uniform EMI protection over all portions of optical element 10, 20. Application of conductive and SWIR-MWIR transparent coating 14, 24 on inner side 26, 30 may be desirable to protect conductive and SWIR-MWIR transparent coating 14, 24 from environmental damage.

Conductive and SWIR-MWIR transparent coating 14, 24 can be a conductive zinc oxide material comprising zinc oxide doped with a conductive material. Ideally, conductive and SWIR-MWIR transparent coating 14, 24 exhibits the same or substantially similar optical properties of substrate 12, 22 such that there is little to no loss in the transmission of optical information. Zinc oxide is a SWIR-MWIR transparent material. Zinc oxide can be applied directly to a surface of an oxide-based ceramic substrate 12, 22 without the addition of an intermediate adhesion or bond coat.

The conductive dopant can be uniformly dispersed within the zinc oxide material to provide a conductive shield sufficient to substantially block radio frequency electromagnetic radiation from reaching an EO/IR sensor. An amount of the conductive dopant in conductive and SWIR-MWIR transparent coating 14, 24 can be selected to provide a required degree of EMI protection while maintaining necessary SWIR-MWIR transmittance through conductive and SWIR-MWIR transparent coating 14, 24. For example, in some embodiments, conductive and SWIR-MWIR transparent coating 14, 24 can include up to about 5 wt. % dopant, or up to about 3 wt. % dopant, or between about 1 wt. % and 3 wt. % dopant.

The conductive dopant can comprise an element having an oxidation state of +3 to contribute an electron to the conduction band of zinc oxide, making SWIR-MWIR transparent coating 14, 24 electrically conductive. For example, in one embodiment, the conductive dopant can be aluminum oxide. In other embodiments, the conductive dopant can be an oxide of gallium or indium. In yet other embodiments, the conductive dopant can be a rare earth oxide, such as yttria or gadolinia. In yet other embodiments, other rare earth elements having a +3 oxidation state can be used to dope zinc oxide. Generally, any element having a +3 oxidation state can be used to dope zinc oxide provided the element is not too large to replace zinc in the zinc oxide lattice. Although oxides can be preferable for ease of manufacturing, dopants can alternatively include elemental materials, such as elemental aluminum, or other elements having three valence electrons.

Conductive and SWIR-MWIR transparent coating 14, 24 can be deposited by RF magnetron sputtering. RF magnetron sputtering is a conventional technique used to deposit thin film oxides. A sputtering device includes a chamber with one or more targets, an RF power supply, and substrate 12, 22. In one embodiment, the target can include a desired conductive and SWIR-MWIR transparent coating composition, for example, an aluminum oxide-doped zinc oxide, having a defined amount of dopant. For example, the target can include a source of zinc oxide doped with 3 wt. % aluminum oxide to form conductive and SWIR-MWIR transparent coating 14, 24 having up to 3 wt. % aluminum oxide. During operation, the species from the target can be sputtered onto a rotating substrate 12, 22 using one or more RF power sources. Certain atoms sputter more efficiently than others. As such, it may be desirable to use a target having a different weight percent of dopant than the desired weight percent dopant in the resulting conductive and SWIR-MWIR transparent coating 14, 24. For example, a target having 3 wt. % dopant may produce a coating having less than 3 wt. % dopant.

In other embodiments, a first target can include a source of zinc oxide and a second target can include a source of dopant, e.g., elemental aluminum. During operation, the species from each of the first and second targets can be co-sputtered onto the rotating substrate 12, 22 using one or more RF power sources. The compositional ratio of the individual target material species into the resulting conductive and SWIR-MWIR transparent coating 14, 24 can be controlled through control of the RF power sources. Conductive and SWIR-MWIR transparent coating material composition, crystalline structure, grain size, and coating thickness can be optimized by controlling target composition and operational parameters, including deposition temperature, pressure, power, and deposition time.

Other methods of depositing conductive and SWIR-MWIR transparent coating 14, 24, including physical and chemical deposition techniques known in the art are within the scope of the present disclosure. For example, in one or more embodiments, zinc oxide can be deposited by RF magnetron sputtering or other methods known in the art and can be doped by ion implantation to form conductive and SWIR-MWIR transparent coating 14, 24. For example, aluminum, gallium, or indium ions may be implanted in the zinc oxide coating. In some embodiments, doping ions can be present in a partial thickness of conductive and SWIR-MWIR transparent coating 14, 24.

Conductive and SWIR-MWIR transparent coating 14, 24 can be deposited in a single layer or multiple layers depending on a desired thickness and deposition technique used. In accordance with one or more embodiments, conductive and SWIR-MWIR transparent coating 14, 24 can have a thickness of up to about 1 micron, or between about 0.5 micron and about 1 micron. Generally, increased thickness of conductive and SWIR-MWIR transparent coating 14, 24 can provide increased electrical conductivity resultant of an increased amount of dopant in conductive and SWIR-MWIR transparent coating 14, 24, but can also result in reduced optical transmission.

Conductive and SWIR-MWIR transparent coating 14, 24 can have an electrical conductivity of about 20 to 30 ohm/square or resistivity of about $10^{-4}$ ohm-cm. Conductive and SWIR-MWIR transparent coating 14, 24 can provide optical transmittance over the SWIR spectrum and a portion of the MWIR spectrum for application with targeted wavelengths in a range of about 2 μm to about 5 μm). A desired electrical conductivity can be provided by increasing or decreasing the amount of doping ions in conductive and SWIR-MWIR transparent coating 14, 24. An optimal optical transmittance of conductive and SWIR-MWIR transparent coating 14, 24 can be achieved by carefully controlling deposition parameters and annealing temperature.

Intermediate layer 16 can optionally be provided to an outer surface of substrate 12, 22 on outer side 28, 32. Intermediate layer 16 can be disposed between substrate 12, 22 and conductive and SWIR-MWIR transparent coating 14, 24 to provide a transition layer between materials having different refractive indices and/or can be provided to improve adhesion between substrate 12, 22 and conductive and SWIR-MWIR transparent coating 14, 24. Intermediate layer 16 can provide a shared element between adjoining conductive and SWIR-MWIR transparent coating 14, 24 and substrate 12, 22 to promote adhesion between the adjoining materials. For example, an intermediate layer 16 comprising yttria can share the common element oxygen with an NCOC substrate 12, 22 and zinc oxide of conductive and SWIR-MWIR transparent coating 14, 24 to promote adhesion between the NCOC and zinc oxide. In some embodiments, conductive and SWIR-MWIR transparent coating 14, 24 can have a refractive index substantially similar to a refractive index of substrate 12, 22. In such embodiments, an intermediate layer 16 may be unnecessary. In some embodiments, conductive and SWIR-MWIR transparent coating 14, 24 can have a different refractive index than substrate 12, 22 and optical impedance matching through application of intermediate layer 16 may be necessary to provide a smooth transition between the two materials. Intermediate layer 16 can be an oxide material having a refractive index that is between the refractive indices of conductive and SWIR-MWIR transparent coating 14, 24 and substrate 12, 22, and thereby can minimize optical losses by reflection at the material interfaces. A thickness of intermediate layer 16 can vary depending on the difference in refractive indices of conductive and SWIR-MWIR transparent coating 14, 24 and substrate 12, 22. In some embodiments, one or more intermediate layers 16 can be provided. The chemical composition of intermediate layer 16 can be selected using conventional modeling software as known in the art.

Anti-reflective coating 18 can optionally be provided on inner side 26, 30 of substrate 12, 22 directly on an inner surface of substrate 12, 22 or outward of conductive and SWIR-MWIR transparent coating 14, 24 if coating 14, 24 is applied on inner side 26, 30. Anti-reflective coating 18 can be used to increase optical transmittance and can further aid in protecting an EO/IR sensor. Anti-reflective coating 18 can be an oxide coating as known in the art and typically used in optical devices. Anti-reflective coating 18 can be deposited by RF magnetron sputtering or other deposition techniques known in the art.

The disclosed conductive and SWIR-MWIR transparent thin film coating can provide full EMI protection for SWIR-MWIR windows and domes. The conductive SWIR-MWIR transparent coating can be applied with uniformity to complex and curved geometries, thereby providing improved EMI protection over conventional EMI grids.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims. Embodiments disclosed herein may be combined with other embodiments and reference to "an embodiment," "an example," "some embodiments," "some examples," "an alternate embodiment," "various embodiments," "one embodiment," "at least one embodiment," "this and other embodiments," "certain embodiments," or the like are not necessarily mutually exclusive and are intended to indicate that a particular feature, structure, or characteristic described may be included in at least one embodiment. The appearances of such terms herein are not necessarily all referring to the same embodiment.

Any relative terms or terms of degree used herein, such as "substantially", "essentially", "generally", "approximately" and the like, should be interpreted in accordance with and subject to any applicable definitions or limits expressly stated herein. In all instances, any relative terms or terms of degree used herein should be interpreted to broadly encompass any relevant disclosed embodiments as well as such ranges or variations as would be understood by a person of ordinary skill in the art in view of the entirety of the present disclosure, such as to encompass ordinary manufacturing tolerance variations, incidental alignment variations, transient alignment or shape variations induced by thermal, rotational or vibrational operational conditions, and the like. Moreover, any relative terms or terms of degree used herein should be interpreted to encompass a range that expressly includes the designated quality, characteristic, parameter or value, without variation, as if no qualifying relative term or term of degree were utilized in the given disclosure or recitation.

Discussion of Possible Embodiments

The following are non-exclusive descriptions of possible embodiments of the present invention.

A shortwave to midwave infrared (SWIR-MWIR) optical window includes a substrate formed from a nanocomposite optical ceramic material and a coating disposed on the substrate to provide electromagnetic interference (EMI) protection. The coating is electrically conductive and SWIR-MWIR transparent and comprises a doped zinc oxide material.

The SWIR-MWIR optical window of the preceding paragraph can optionally include, additionally and/or alternatively, any one or more of the following features, configurations and/or additional components:

The SWIR-MWIR optical window of the preceding paragraph, wherein a dopant of the doped zinc oxide material has a +3 oxidation state.

The SWIR-MWIR optical window of any of the preceding paragraphs, wherein the dopant is aluminum.

The SWIR-MWIR optical window of any of the preceding paragraphs, wherein the doped zinc oxide material comprises up to 3 wt. % dopant.

The SWIR-MWIR optical window of any of the preceding paragraphs, wherein a dopant of the doped zinc oxide is uniformly distributed in the coating.

The SWIR-MWIR optical window of any of the preceding paragraphs, wherein the coating is applied as a thin film over the outer side of the optical window.

The SWIR-MWIR optical window of any of the preceding paragraphs, wherein the coating has a thickness of up to 1 micron The SWIR-MWIR optical window of any of the preceding paragraphs, wherein the coating has a conductivity of 20 to 30 Ohm/square.

The SWIR-MWIR optical window of any of the preceding paragraphs can further include an intermediate layer disposed between the substrate and the coating, the intermediate layer having a refractive index between refractive indices of the coating and the substrate.

The SWIR-MWIR optical window of any of the preceding paragraphs, wherein the intermediate layer is an oxide.

The SWIR-MWIR optical window of any of the preceding paragraphs, wherein the substrate has a curved shape.

The SWIR-MWIR optical window of any of the preceding paragraphs can further include an anti-reflective coating disposed on an inner side of the substrate.

An electro-optical or infrared (EO/IR) sensor can include the SWIR-MWIR optical window of any of the preceding paragraphs, A method of protecting an EO/IR sensor from electromagnetic interference (EMI) includes depositing a thin film electrically conductive and SWIR-MWIR transparent coating over a surface an optical window of the EO/IR sensor. The optical window is formed from a nanocomposite optical ceramic material and has a curved surface. The thin film electrically conductive and SWIR-MWIR transparent coating comprises an electrically conductive zinc oxide material.

The method of the preceding paragraph can optionally include, additionally and/or alternatively, any one or more of the following steps, features, configurations and/or additional components:

The method of the preceding paragraph, wherein the conductive zinc oxide material comprises a doped zinc oxide having a dopant selected from a group of elements having a valence number of 3, and wherein the optical window is an oxide-based ceramic material.

The method of any of the preceding paragraphs, wherein the thin film electrically conductive and SWIR-MWIR transparent coating is deposited by magnetron sputtering and wherein a target material comprises zinc oxide and aluminum oxide.

The invention claimed is:

1. A shortwave to midwave infrared (SWIR-MWIR) optical window comprising:
   a substrate formed from a nanocomposite optical ceramic material and providing transmittance in the SWIR-MWIR spectrum; and
   a coating disposed on the substrate to provide electromagnetic interference (EMI) protection, wherein the coating is electrically conductive and SWIR-MWIR transparent and wherein the coating comprises a doped zinc oxide material,
   wherein the nanocomposite optical ceramic material is a multi-phase composite material formed of a mixture of two or more ceramic phases that are mutually insoluble, thereby forming a multi-phase grain structure having distinct phase separation between two or more constituents.

2. The SWIR-MWIR optical window of claim 1, wherein a dopant of the doped zinc oxide material has a +3 oxidation state.

3. The SWIR-MWIR optical window of claim 2, wherein the dopant is aluminum.

4. The SWIR-MWIR optical window of claim 2, wherein the doped zinc oxide material comprises up to 3 wt. % dopant.

5. The SWIR-MWIR optical window of claim 1, wherein a dopant of the doped zinc oxide is uniformly distributed in the coating.

6. The SWIR-MWIR optical window of claim 5, wherein the coating is applied as a thin film over an outer side of the optical window.

7. The SWIR-MWIR optical window of claim 6, wherein the coating has a thickness of up to 1 micron.

8. The SWIR-MWIR optical window of claim 1, wherein the coating has a conductivity of 20 to 30 Ohm/square.

9. The SWIR-MWIR optical window of claim 1, and further comprising an intermediate layer disposed between the substrate and the coating, the intermediate layer having a refractive index between refractive indices of the coating and the substrate.

10. The SWIR-MWIR optical window of claim 9, wherein the intermediate layer is an oxide.

11. The SWIR-MWIR optical window of claim 1, wherein the substrate has a curved shape.

12. The SWIR-MWIR optical window of claim 1, and further comprising an anti-reflective coating disposed on an inner side of the substrate.

13. An electro-optical or infrared (EO/IR) sensor comprising the SWIR-MWIR optical window of claim 1.

14. A method of protecting an EO/IR sensor from electromagnetic interference (EMI), the method comprising:
depositing a thin film electrically conductive and SWIR-MWIR transparent coating over a surface of an optical window of the EO/IR sensor;
wherein the optical window is formed from a nanocomposite optical ceramic material providing transmittance in the SWIR-MWIR spectrum, wherein the nanocomposite optical ceramic material is a multi-phase composite material formed of a mixture of two or more ceramic phases that are mutually insoluble, thereby forming a multi-phase grain structure having distinct phase separation between two or more constituents;
wherein the thin film electrically conductive and SWIR-MWIR transparent coating comprises an electrically conductive zinc oxide material; and
wherein the surface of the optical window is curved.

15. The method of claim 14, wherein the conductive zinc oxide material comprises a doped zinc oxide having a dopant selected from a group of elements having a valence number of 3, and wherein the optical window is an oxide-based ceramic material.

16. The method of claim 15, wherein the thin film electrically conductive and SWIR-MWIR transparent coating is deposited by magnetron sputtering and wherein a target material comprises zinc oxide and aluminum oxide.

* * * * *